United States Patent
Katayama

(10) Patent No.: US 8,969,910 B2
(45) Date of Patent: Mar. 3, 2015

(54) SILICONE RESIN COMPOSITION, SILICONE RESIN SHEET, METHOD FOR PRODUCING SILICONE RESIN SHEET, AND OPTICAL SEMICONDUCTOR DEVICE

(71) Applicant: Nitto Denko Corporation, Ibaraki-shi, Osaka (JP)

(72) Inventor: Hiroyuki Katayama, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 14/186,014

(22) Filed: Feb. 21, 2014

(65) Prior Publication Data

US 2014/0171579 A1 Jun. 19, 2014

Related U.S. Application Data

(63) Continuation of application No. 13/554,588, filed on Jul. 20, 2012.

(30) Foreign Application Priority Data

Jul. 22, 2011 (JP) .................... 2011-160630

(51) Int. Cl.
| | |
|---|---|
| C08L 83/07 | (2006.01) |
| H01L 33/56 | (2010.01) |
| B32B 37/14 | (2006.01) |
| C09D 183/04 | (2006.01) |
| C08L 83/04 | (2006.01) |
| G02B 1/04 | (2006.01) |
| H01L 23/29 | (2006.01) |
| C08K 5/19 | (2006.01) |
| C08G 77/12 | (2006.01) |
| C08G 77/20 | (2006.01) |

(52) U.S. Cl.
CPC ............. *C09D 183/04* (2013.01); *C08K 5/19* (2013.01); *C08G 77/12* (2013.01); *C08G 77/20* (2013.01); *C08L 83/04* (2013.01); *G02B 1/04* (2013.01); *H01L 23/296* (2013.01); *H01L 2924/0002* (2013.01)
USPC ........ 257/100; 525/477; 156/60; 257/E33.059

(58) Field of Classification Search
None
See application file for complete search history.

(56) References Cited

U.S. PATENT DOCUMENTS

| | | | |
|---|---|---|---|
| 5,096,990 A | 3/1992 | Takayanagi et al. | |
| 5,288,795 A | 2/1994 | Fujiki et al. | |

(Continued)

FOREIGN PATENT DOCUMENTS

| | | |
|---|---|---|
| EP | 0 491 598 A2 | 6/1992 |
| EP | 2 196 503 A1 | 6/2010 |

(Continued)

OTHER PUBLICATIONS

Gelest catalog, "Reactive Silicones: Forging new polymer links", 2004, 64 pages.*

(Continued)

*Primary Examiner* — Robert S Loewe
(74) *Attorney, Agent, or Firm* — Sughrue Mion, PLLC

(57) ABSTRACT

A silicone resin composition includes (1) an organopolysiloxane having at least two alkenylsilyl groups in one molecule, (2) an organopolysiloxane having at least two hydrosilyl groups in one molecule, (3) a hydrosilylation catalyst, and (4) a curing retarder, wherein the curing retarder contains tetraalkylammonium hydroxide.

1 Claim, 1 Drawing Sheet

(56) References Cited

U.S. PATENT DOCUMENTS

| | | | |
|---|---|---|---|
| 5,569,688 A | 10/1996 | Meguriya et al. | |
| 5,863,969 A * | 1/1999 | Ward et al. | 523/213 |
| 5,908,592 A | 6/1999 | Kimura et al. | |
| 5,908,878 A * | 6/1999 | Baity et al. | 523/203 |
| 5,977,220 A * | 11/1999 | Burkus et al. | 524/99 |
| 5,998,516 A | 12/1999 | Burkus et al. | |
| 6,235,862 B1 | 5/2001 | Isshiki et al. | |
| 6,750,279 B1 * | 6/2004 | Wang | 524/380 |
| 7,595,113 B2 | 9/2009 | Miyoshi | |
| 2003/0166777 A1 | 9/2003 | Vachon | |
| 2004/0116640 A1 | 6/2004 | Miyoshi | |
| 2004/0213973 A1 | 10/2004 | Hara et al. | |
| 2005/0212008 A1 | 9/2005 | Miyoshi | |
| 2008/0185601 A1 | 8/2008 | Frisch et al. | |
| 2010/0148378 A1 | 6/2010 | Katayama et al. | |
| 2011/0186893 A1 | 8/2011 | Kondo et al. | |
| 2011/0248312 A1 | 10/2011 | Katayama | |
| 2011/0260209 A1 | 10/2011 | Katayama | |
| 2012/0306107 A1 | 12/2012 | Mitani et al. | |
| 2013/0023109 A1 | 1/2013 | Harkness | |

FOREIGN PATENT DOCUMENTS

| | | |
|---|---|---|
| JP | 4-216864 A | 8/1992 |
| JP | 11-246764 A | 9/1999 |
| JP | 2000-198930 A | 7/2000 |
| JP | 2004-186168 A | 7/2004 |
| JP | 2007-123452 A | 5/2007 |
| JP | 2008-150437 A | 7/2008 |
| JP | 2009-84511 A | 4/2009 |
| JP | 4383768 B2 | 12/2009 |
| JP | 2010-265436 A | 11/2010 |
| JP | 2011-219597 A | 11/2011 |

OTHER PUBLICATIONS

European Search Report issued in Application No. 12175681.1 dated Oct. 24, 2012.

Notification of Reasons for Refusal dated Nov. 25, 2014, issued by the Japanese Patent Office in counterpart Japanese application No. 2011-160630.

* cited by examiner

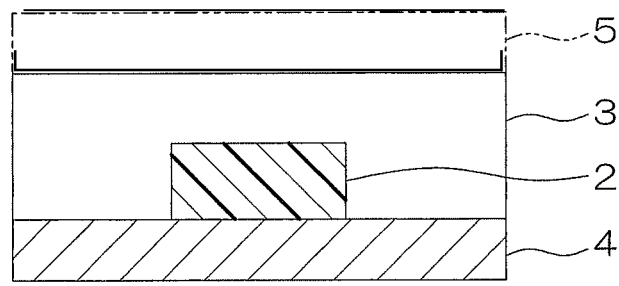
1

SILICONE RESIN COMPOSITION, SILICONE RESIN SHEET, METHOD FOR PRODUCING SILICONE RESIN SHEET, AND OPTICAL SEMICONDUCTOR DEVICE

CROSS-REFERENCE TO RELATED APPLICATION

This is a continuation of application Ser. No. 13/554,588 filed Jul. 20, 2012, which claims priority based on Japanese Patent Application No. 2011-160630 filed on Jul. 22, 2011, the contents of which are hereby incorporated by reference into this application.

BACKGROUND OF THE INVENTION

1. Field of the Invention

The present invention relates to a silicone resin composition, a silicone resin sheet, a method for producing a silicone resin sheet, and an optical semiconductor device. In particular, the present invention relates to an addition cure type silicone resin composition; a silicone resin sheet composed of the silicone resin composition; a method for producing the sheet; and an optical semiconductor device in which the sheet is used for encapsulation.

2. Description of Related Art

High output white LED devices which has been examined for general light application are required to have an encapsulating material that has excellent light resistance and heat resistance, and recently, so called "addition cure type silicone" is widely used. The addition cure type silicone is obtained by allowing a mixture mainly composed of a silicone derivative having a vinyl group in its main chain and a silicone derivative having a hydrosilyl group (SiH group) in its main chain to thermally cure in the presence of a platinum catalyst, and examples thereof are disclosed in Japanese Unexamined Patent Publication No. 2000-198930, Japanese Unexamined Patent Publication No. 2004-186168, and Japanese Unexamined Patent Publication No. 2008-150437.

As a method for encapsulating an LED element using such an addition cure type silicone, because the addition cure type silicone is liquid before curing, preferably, a "potting" method is used: in the potting, a cup in which an LED element is disposed is filled with a resin, and thereafter curing by heat is carried out.

However, in the method, when producing a chip array module, which is recently becoming a mainstream production, and in which a plurality of LED elements are disposed on a substrate, the height of the encapsulating resin are varied due to sagging, which causes insufficient optical characteristics in the obtained LED device. Also, viscosity of the resin before being cured easily changes depending on the environment that surrounds the resin, and therefore there are disadvantages such as poor productivity because of such unstable potting conditions.

In contrast, a method in which an LED element is encapsulated using a sheet resin is proposed. For example, in Japanese Unexamined Patent Publication No. 2007-123452, an encapsulating sheet composed of an ethylene-vinyl acetate polymer and polyurethane is disclosed, and in Japanese Patent No. 4383768, an encapsulating sheet composed of a crosslinkable thermoplastic resin of an ethylene(meth)acrylate copolymer is disclosed. Furthermore, in Japanese Unexamined Patent Publication No. 2009-84511, an encapsulating sheet composed of a thermosetting silicone resin and a thermoplastic silicone resin is disclosed.

SUMMARY OF THE INVENTION

However, conventional resin sheets are still unsatisfactory as an encapsulating material for high output LED elements, because light resistance and heat resistance of the organic groups that undergo crosslinking reaction are insufficient.

Furthermore, the resin sheet is sometimes stored once until use, and therefore storage stability is required. To be specific, it is required that a hardness (low hardness) that allows for use as an encapsulating material even after the storage is kept.

An object of the present invention is to provide a silicone resin composition that can achieve production of a silicone resin sheet having excellent light resistance and heat resistance, and also excellent storage stability; a silicone resin sheet obtained by using the silicone resin composition; a method for producing the sheet; and an optical semiconductor device in which the sheet is used for encapsulation.

The present invention relates to the following:

[1] A silicone resin composition including (1) an organopolysiloxane having at least two alkenylsilyl groups in one molecule, (2) an organopolysiloxane having at least two hydrosilyl groups in one molecule, (3) a hydrosilylation catalyst, and (4) a curing retarder, wherein the curing retarder contains tetraalkylammonium hydroxide;

[2] A silicone resin sheet obtained by molding the silicone resin composition of the [1] described above into a sheet, and then semi-curing the sheet;

[3] A method for producing a silicone resin sheet including a step of molding the silicone resin composition of the [1] described above into a sheet, and then heating the sheet at 40 to 150° C. for 0.1 to 120 minutes to be semi-cured; and

[4] An optical semiconductor device obtained by encapsulating an optical semiconductor element using the silicone resin sheet of the [2] described above.

A silicone resin sheet of the present invention composed of a silicone resin composition of the present invention and obtained by a method for producing a silicone resin sheet of the present invention has excellent light resistance and heat resistance, and also is excellent in storage stability, and therefore achieves excellent effects such as excellent encapsulation of, for example, optical semiconductor elements.

Thus, an optical semiconductor device in which an optical semiconductor element is encapsulated using the silicone resin sheet can ensure excellent durability.

BRIEF DESCRIPTION OF THE DRAWINGS

FIG. 1 is a schematic diagram illustrating the configuration of an optical semiconductor device in an embodiment of the present invention.

DETAILED DESCRIPTION OF THE INVENTION

A silicone resin composition of the present invention contains, (1) an organopolysiloxane having at least two alkenylsilyl groups in one molecule, (2) an organopolysiloxane having at least two hydrosilyl groups in one molecule, (3) a hydrosilylation catalyst, and (4) a curing retarder.

(1) Organopolysiloxane Having at Least Two Alkenylsilyl Groups in One Molecule

In the present invention, as a constituent monomer of the resin, in view of forming cross-linkage, an organopolysiloxane having at least two alkenylsilyl groups in one molecule (hereinafter also referred to as organopolysiloxane A) is used.

The alkenylsilyl group is a group in which an alkenyl group is bonded to a silicon atom, and the alkenylsilyl group may be positioned at any of molecule-end, main chain, and side chain.

The alkenyl group represents a substituted or non-substituted alkenyl group, and as long as it is an organic group including an alkenyl group in its skeleton, the alkenyl group may be straight chain, branched, or cyclic. The number of carbons in the organic group is, in view of transparency and heat resistance, preferably 1 to 20, more preferably 1 to 10. To be specific, examples thereof include a vinyl group, an allyl group, a propenyl group, a butenyl group, a pentenyl group, a hexenyl group, a heptenyl group, an octenyl group, a norbornenyl group, and a cyclohexenyl group. Of these examples, in view of reactivity in hydrosilylation reaction, a preferable example is vinyl group.

The organic group bonded to a silicon atom other than the alkenyl group is not particularly limited, and examples thereof include a monovalent hydrocarbon group.

Examples of monovalent hydrocarbon groups include a straight chain, branched, or cyclic saturated hydrocarbon group or an aromatic hydrocarbon group. The number of carbons in the hydrocarbon group is, in view of transparency and heat resistance, preferably 1 to 20, more preferably 1 to 10. To be specific, examples thereof include a methyl group, an ethyl group, a propyl group, a butyl group, a pentyl group, a hexyl group, a phenyl group, a naphthyl group, a cyclohexyl group, and a cyclopentyl group. Of these examples, in view of transparency, heat resistance, and light resistance of the resin composition to be obtained, preferable examples are a methyl group and a phenyl group, and a more preferable example is a methyl group.

Specific examples of the organopolysiloxane A include, in addition to straight chain types of a vinyl-terminated polydimethylsiloxane (dimethylvinylsilyl-terminated polydimethylsiloxane), a vinyl-terminated dimethylsiloxane-diphenylsiloxane copolymer, a vinyl-terminated poly(methyl) (phenyl)siloxane, a vinyl-terminated dimethylsiloxane-diethylsiloxane copolymer, a trimethylsiloxy-terminated dimethylsiloxane-methyl(vinyl)siloxane copolymer, a silanol-terminated dimethylsiloxane-methyl(vinyl)siloxane copolymer, a vinyl-terminated dimethylsiloxane-methyl(vinyl)siloxane copolymer, and a trimethylsiloxy-terminated poly(methyl)(vinyl)siloxane; cyclic types of these; branched types of these; and three-dimensional network types of these. These examples of the organopolysiloxane A may be used singly or in combination of two or more.

The above-described compounds can be a commercially available product, or can be synthesized according to a known method.

The number average molecular weight (GPC measurement, polystyrene standard calibration) of the organopolysiloxane A is, for example, 10000 to 100000, preferably 15000 to 50000.

The alkenylsilyl group functional group equivalent of the organopolysiloxane A is, in view of tenacity and flexibility of the cured product, preferably 0.005 to 10 mmol/g, more preferably 0.010 to 5 mmol/g. When the alkenylsilyl group functional group equivalent of the organopolysiloxane A is 0.005 mmol/g or more, sufficient strength is exhibited, and when the alkenylsilyl group functional group equivalent of the organopolysiloxane A is 10 mmol/g or less, excellent flexibility is exhibited. In this specification, the functional group equivalent of the silicone derivative is the molarity of the alkenylsilyl group per 1 g of the organopolysiloxane A, and can be measured by $^1$H-NMR using an internal standard substance.

The viscosity at 25° C. of the organopolysiloxane A is, in view of tenacity of the cured product, preferably 100 to 500000 mPa·s, more preferably 300 to 100000 mPa·s. The viscosity in this specification can be measured using a B-type viscometer.

The organopolysiloxane A content is, in the silicone resin composition of the present invention, preferably 0.1 to 99.9 mass %, more preferably 1 to 99 mass %.

(2) Organopolysiloxane Having at Least Two Hydrosilyl Groups in One Molecule

In the present invention, as a constituent monomer of the resin, in view of forming cross-linkage, organopolysiloxane having at least two hydrosilyl groups in one molecule (hereinafter also referred to as organopolysiloxane B) is used.

The hydrosilyl group is a group in which a hydrogen atom is bonded to a silicon atom, and may be positioned at any of the molecular end, main chain, and side chain.

An organic group bonded to a silicon atom other than the hydrosilyl group is not particularly limited, and examples thereof include a monovalent hydrocarbon group.

Examples of monovalent hydrocarbon groups include those given as examples of monovalent hydrocarbon groups in the above-described organopolysiloxane A. Of these examples, in view of transparency, heat resistance, and light resistance of the resin composition to be obtained, preferable examples are a methyl group and a phenyl group, and a more preferable example is a methyl group.

Specific examples of the organopolysiloxane B include, in addition to straight chain types of a dimethylsilyl-terminated polydimethylsiloxane, a dimethylsilyl-terminated dimethylsiloxane-diphenylsiloxane copolymer, a dimethylsilyl-terminated poly(methyl)(phenyl)siloxane, a dimethylsilyl-terminated dimethylsiloxane-diethylsiloxane copolymer, a trimethylsiloxy-terminated dimethylsiloxane-methyl(hydro) siloxane copolymer (trimethylsilyl-terminated dimethylsiloxane-methylhydrosiloxane copolymer), and a trimethylsiloxy-terminated poly(methyl)(hydro)siloxane; cyclic types of these; branched types of these; and three-dimensional network types of these. These examples of the organopolysiloxane B may be used singly or in combination of two or more.

The above-described compounds may be a commercially available product, or can be synthesized according to a known method.

The number average molecular weight (GPC measurement, polystyrene standard calibration) of the organopolysiloxane B is, for example, 500 to 5000, preferably 1000 to 3000.

The hydrosilyl group functional group equivalent of the organopolysiloxane B is, in view of tenacity and flexibility of the cured product, preferably 0.005 to 10 mmol/g, more preferably 0.010 to 5 mmol/g. When the hydrosilyl group functional group equivalent of the organopolysiloxane B is 0.005 mmol/g or more, sufficient strength is exhibited, and when the hydrosilyl group functional group equivalent of the organopolysiloxane B is 10 mmol/g or less, excellent flexibility is exhibited. In this specification, the functional group equivalent of the silicone derivative is the molarity of the hydrosilyl group per 1 g of the organopolysiloxane B, and can be measured by $^1$H-NMR using an internal standard substance.

The viscosity at 25° C. of the organopolysiloxane B is, in view of tenacity of the cured product, preferably 5 to 500000 mPa·s, more preferably 10 to 100000 mPa·s.

The organopolysiloxane B content is, in the silicone resin composition of the present invention, preferably 0.1 to 99.9 mass %, more preferably 1 to 99 mass %.

The organopolysiloxane B content is, in view of tenacity of the cured product, relative to 100 parts by mass of the organopolysiloxane A, preferably 0.1 to 1000 parts by mass, more preferably 1 to 100 parts by mass, even more preferably 1 to 10 parts by mass, particularly preferably 1 to 5 parts by mass.

The molar ratio of the organopolysiloxane A to the organopolysiloxane B in the silicone resin composition of the present invention is, that is, the molar ratio (alkenylsilyl group/hydrosilyl group) of the above-described functional groups is, in view of allowing the alkenylsilyl group of the organopolysiloxane A to sufficiently react with the hydrosilyl group of the organopolysiloxane B, preferably 1/50 to 50/1, more preferably 1/5 to 5/1.

(3) Hydrosilylation Catalyst

The hydrosilylation catalyst of the present invention is not particularly limited as long as it is a compound that catalyzes hydrosilylation reaction between the alkenylsilyl group and the hydrosilyl group, and examples thereof include platinum catalysts such as platinum black, platinum chloride, chloroplatinic acid, platinum-olefin complexes including platinum-divinyltetramethyldisiloxane complexes, platinum-carbonyl complexes, and platinum-acetylacetate; palladium catalysts; and rhodium catalysts. Of these examples, in view of compatibility, transparency, and catalytic activity, preferably, a platinum-olefin complex is used, more preferably, a platinum-divinyltetramethyldisiloxane complex is used.

The hydrosilylation catalyst content is, for example, as follows: when a platinum catalyst is used, in view of the curing speed, the platinum content relative to 100 parts by mass of the organopolysiloxane A is preferably $1.0 \times 10^{-4}$ to 0.5 parts by mass, more preferably $1.0 \times 10^{-3}$ to 0.05 parts by mass.

(4) Curing Retarder

The curing retarder of the present invention contains, as an essential component, tetraalkylammonium hydroxide.

The tetraalkylammonium hydroxide has effects of suppressing curing over hydrosilylation catalysts, and is a hydroxide of ammonium having four alkyl groups (straight chain, branched chain, or cyclic saturated hydrocarbon group) that may have the same or different substituents.

Examples of such tetraalkylammonium hydroxides include, to be specific, tetra non-substituted alkylammonium hydroxides such as tetramethylammonium hydroxide, tetraethylammonium hydroxide, tetrapropylammonium hydroxide, tetrabutylammonium hydroxide, tetrahexylammonium hydroxide, tetradecylammonium hydroxide, and hexadecyltrimethylammonium hydroxide; and tetra substituted alkylammonium hydroxides such as tetra(2-hydroxyethyl)ammonium hydroxide and benzyltrimethylammonium hydroxide.

These examples of the tetraalkylammonium hydroxides may be used singly or in combination of two or more.

The above-described tetraalkylammonium hydroxides may be a commercially available product, or can be synthesized according to a known method.

As the tetraalkylammonium hydroxide, in view of availability, heat resistance, and curing reaction suppressing ability, preferably, tetramethylammonium hydroxide or tetrabutylammonium hydroxide is used.

These tetraalkylammonium hydroxides can be used in solid state, or in solution state. In view of dispersiveness in the silicone resin, a solution state is preferable.

When using the tetraalkylammonium hydroxide in solution state, the solvent is not particularly limited, and examples thereof include monohydric alcohols such as methanol and ethanol.

The tetraalkylammonium hydroxide content is, in view of balance between storage stability and curing properties in semi-cured state, relative to 1 mol of the hydrosilylation catalyst, preferably 1 to 1000 mol, more preferably 10 to 500 mol. When the tetraalkylammonium hydroxide content is 1 mol or more, sufficient effects of suppressing curing can be obtained, and the changes in hardness are less even if the obtained cured product is stored; and when the tetraalkylammonium hydroxide content is 1000 mol or less, the curing does not take excessively long time, and the heat resistance of the cured product is not reduced.

The curing retarder can contain, as an optional component, other curing retarders (curing retarder excluding tetraalkylammonium hydroxide).

Other curing retarders are not particularly limited as long as the curing retarder is a compound having effects of suppressing curing over the hydrosilylation catalyst, and examples thereof include acetylene compounds, olefin compounds, phosphorus compounds, nitrogen compounds, sulfur compounds, and organic peroxides, i.e., acetylene compounds such as 1-ethinylcyclohexanol, and 3-methyl-1-butyne-3-ol; olefin compounds such as 1,3,5,7-tetravinyl-1,3,5,7-tetramethylcyclotetrasiloxane and dimethyl maleate; phosphorus compounds such as triphenylphosphine; nitrogen compounds such as tributylamine, tetramethylethylene diamine, imidazole, and benzotriazole; sulfur compounds such as benzothiazole; and organic peroxides.

These other curing retarders may be used singly or in combination of two or more.

When these other curing retarders is blended, the mixing ratio of the other curing retarder is appropriately set according to the purpose and application.

The silicone resin composition of the present invention can be prepared by mixing the above-described components.

In the silicone resin composition, preferably, as the organopolysiloxane component, only the above-described organopolysiloxane A and the above-described organopolysiloxane B are blended.

The silicone resin composition of the present invention may contain, in addition to the above-described components, other optional components in the range that does not damage the effects of the present invention. Such other optional components include, for example, inorganic fillers such as silica, aluminum oxide (alumina), titanium oxide, zirconium oxide, magnesium oxide, zinc oxide, iron oxide, aluminum hydroxide, calcium carbonate, layered mica, carbon black, diatomite, glass fiber, silicone particles, oxide•nitride•oxynitride phosphor activated with lanthanoid elements; and these fillers with their surface treated with organic silicon compounds such as organoalkoxysilane, organochlorosilane, and organosilazane. The filler content relative to 100 parts by mass of the organopolysiloxane A is, preferably 1 to 100 parts by mass, more preferably 1 to 75 parts by mass, even more preferably 1 to 20 parts by mass.

Furthermore, additives such as antioxidants, modifiers, surfactants, dyes, pigments, discoloration inhibitors, ultraviolet absorbers, creep hardening prevention agents, plasticizers, thixotropic agents, and antifungal agents may be contained.

Such a silicone resin composition is used, without limitation, as various encapsulating materials. Preferably, such a silicone resin composition is used as a silicone resin sheet formed from a semi-cured silicone resin composition, more preferably, used as a silicone resin sheet formed from only the above-described organopolysiloxane A and the organopolysiloxane B as the organopolysiloxane component.

The silicone resin sheet of the present invention is obtained by semi-curing the above-described silicone resin composition, and is mainly characterized in that by using tetraalkylammonium hydroxide as the curing retarder, curing of the addition cure type silicone resin is adjusted to be semi-cured.

With the addition cure type silicone resin, usually, a highly active platinum catalyst is used, and therefore once the curing reaction starts, it is very difficult to stop the reaction halfway, and creating semi-cured (B-stage) state is difficult. Thus, to decrease catalytic activity of the platinum catalyst, it has been known that adding phosphorus, nitrogen, sulfur compounds, or acetylenes as a reaction suppressing agent is effective. However, compounds known as the reaction suppressing agent affect durability of the resin, and therefore in the present invention, by controlling the curing reaction of the addition cure type silicone resin with use of tetraalkylammonium hydroxide, semi-cured state is created, and because tetraalkylammonium hydroxide does not affect the stability of the resin, excellent stability is ensured even after the encapsulation.

A silicone resin sheet of the present invention can be prepared as follows: a silicone resin composition is prepared by stirring the above-described components (1) to (4), as necessary with a filler and additives added, preferably at 0 to 60° C. for 1 to 120 minutes; and then the obtained composition is molded into a sheet. To be specific, for example, on a release sheet (e.g., organic polymer such as polyester base material, ceramics, metal, etc.) with its surface treated for release, the above-described composition is applied to give an appropriate thickness by a method such as casting, spin coating, or roll coating; and then the composition was dried by heating, thereby molding the composition into a sheet. The above-described heating allows partial progression of hydrosilylation reaction, and the obtained sheet is allowed to be in semi-cured (B-STAGE) state.

The heating temperature is preferably 20 to 200° C., more preferably 40 to 150° C. The heating time is preferably 0.1 to 120 minutes, more preferably 1 to 60 minutes.

The silicone resin sheet has a thickness of, without particular limitation, preferably 20 to 10000 μm, more preferably 50 to 3000 μm.

The silicone resin sheet of the present invention has a hardness of, in view of collective encapsulation of the optical semiconductor elements using the sheet, preferably 0.1 to 10, more preferably 0.1 to 5. In this specification, the hardness of the silicone resin sheet can be calculated based on the following formula, for example, using a digital length measuring system, by measuring the distance of the sensor head displaced from the sheet surface when a load of 7 g/mm$^2$ is applied with the sensor head.

The sheet hardness=[1−{distance of sensor head displaced (μm)/thickness of sample (μm)}]×100

When the silicone resin sheet of the present invention is stored, for example, at 5° C. for 24 hours, the sheet hardness is preferably 0.1 to 10, more preferably 0.1 to 5.

The thus obtained silicone resin sheet is in semi-cured state, and therefore an optical semiconductor device can be prepared by, for example, as follows: the thus obtained silicone resin sheet is placed on an optical semiconductor element as is, or the thus obtained silicone resin sheet is placed on an optical semiconductor element with a known resin potted and then encapsulation is performed; and then thereafter the resin sheet is heated at high temperature to be completely cured.

FIG. 1 is a schematic diagram illustrating the configuration of the optical semiconductor device in an embodiment of the present invention.

In FIG. 1, an optical semiconductor device 1 includes a light-emitting diode element 2 as an optical semiconductor element, and a silicone resin sheet 3 that encapsulates the light-emitting diode element 2.

The light-emitting diode element 2 is mounted on a mounting substrate 4. To be specific, the light-emitting diode element 2 is mounted on the top face of the mounting substrate 4 by wire bonding or flip chip bonding.

Then, the light-emitting diode element 2 is encapsulated by the silicone resin sheet 3 in semi-cured state on the mounting substrate 4, and by allowing the silicone resin sheet 3 to cure completely, the optical semiconductor device 1 is formed.

The complete curing of the silicone resin sheet of the present invention is done by reaction of the residual functional group relating to the hydrosilylation reaction from the reaction when the above-described sheet is prepared. Progression of the hydrosilylation reaction can be checked by IR measurement based on the degree of the peak absorption derived from the hydrosilyl group. For example, when the absorption intensity is below 20% of the initial value (before curing reaction, that is, the absorption intensity of the sheet before placement), it can be determined that the hydrosilylation reaction is completed and the complete curing is achieved.

The method for placing the sheet on the substrate and then carrying out the encapsulation is not particularly limited. For example, a method of performing thermocompression bonding by heating, preferably at 100 to 200° C. and 0.01 to 10 MPa, more preferably at 120 to 180° C. and 0.1 to 1 MPa, for 2 to 600 seconds using a laminator or a pressing apparatus; and then carrying out encapsulation is used.

The heating temperature at the encapsulation processing is preferably 120 to 250° C., more preferably 150 to 200° C. The heating time is preferably 0.1 to 48 hours, more preferably 0.1 to 24 hours.

In the optical semiconductor device 1, as shown in the phantom line in FIG. 1, as necessary, a phosphor layer 5 can be laminated on the surface (face opposite to the face encapsulating the light-emitting diode element 2) of the silicone resin sheet 3.

The phosphor layer 5 is not particularly limited, and can be formed, for example, from a phosphor composition containing a garnet phosphor such as $Y_3Al_5O_{12}$:Ce (YAG (yttrium•aluminum•garnet):Ce) and a resin, and can also be formed as a ceramic plate containing a garnet phosphor.

By laminating such a phosphor layer 5, for example, the color of light generated by the light-emitting diode element 2 and the color of light generated by the phosphor layer 5 can be mixed, allowing a desired color to be generated.

EXAMPLES

In the following, the present invention will be described based on Examples and Comparative Examples, but the present invention is not limited thereto.

Example 1

20 g (1.4 mmol vinylsilyl group) of dimethylvinylsilyl-terminated polydimethylsiloxane (vinylsilyl group equivalent 0.071 mmol/g), 0.40 g (1.6 mmol hydrosilyl group) of a trimethylsilyl-terminated dimethylsiloxane-methylhydrosiloxane copolymer (hydrosilyl group equivalent 4.1 mmol/g), 2 g of hexamethyldisilazane-treated silica particles, 0.036 mL (1.9 μmol) of a solution (platinum concentration 2 mass %) of platinum-divinyltetramethyldisiloxane complex in xylene, and 0.063 mL (57 μmol) of a solution (10 mass %) of tetramethylammonium hydroxide in methanol were mixed; and the mixture was stirred at 20° C. for 10 minutes, thereby preparing a silicone resin composition.

Then, the obtained silicone resin composition was applied on a polyester film (50 μm thickness) to give a thickness (applied silicone resin composition) of 600 μm, and then heated under the conditions shown in Table 1, thereby producing a silicone resin sheet in semi-cured state.

Example 2

A silicone resin sheet in semi-cured state was obtained in the same manner as in Example 1, except that instead of 20 g of dimethylvinylsilyl-terminated polydimethylsiloxane (vinylsilyl group equivalent 0.071 mmol/g), 35 g (1.4 mmol vinylsilyl group) of dimethylvinylsilyl-terminated polydimethylsiloxane (vinylsilyl group equivalent 0.040 mmol/g) was used.

Example 3

A silicone resin sheet in semi-cured state was obtained in the same manner as in Example 1, except that instead of 0.40 g of a trimethylsilyl-terminated dimethylsiloxane-methylhydrosiloxane copolymer (hydrosilyl group equivalent 4.1 mmol/g), 0.23 g (1.6 mmol hydrosilyl group) of a trimethylsilyl-terminated dimethylsiloxane-methylhydrosiloxane copolymer (hydrosilyl group equivalent 7.1 mmol/g) was used.

Example 4

A silicone resin sheet in semi-cured state was obtained in the same manner as in Example 1, except that instead of 0.063 mL of the solution (10 mass %) of tetramethylammonium hydroxide in methanol, 0.18 mL (58 μmol) of a solution (10 mass %) of tetrabutylammonium hydroxide in methanol was used.

Comparative Example 1

A silicone resin sheet in semi-cured state was obtained in the same manner as in Example 1, except that a solution of tetramethylammonium hydroxide in methanol was not used.

Preparation Example 1 of Completely Cured Product

The silicone resin sheet in semi-cured state was heated at 150° C. for 5 hours, thereby preparing a completely cured silicone resin sheet.

Production Example 1 of Optical Semiconductor Device

A substrate on which a blue LED was mounted was covered with the above-described silicone resin sheet (silicone resin sheet in semi-cured state) that had been stored at 5° C. for 24 hours; and they were heated under reduced pressure at 160° C. for 5 minutes to carry out compression bonding with a pressure of 0.2 MPa. Then, the substrate and the silicone resin sheet were heated at 150° C. for 5 hours, thereby producing an optical semiconductor device.

The obtained semi-cured product, completely cured product, and optical semiconductor device were evaluated for their characteristics based on Examination Examples 1 to 6 below. The results are shown in Table 1.

Examination Example 1

Hardness

The sheet hardness of the semi-cured product and completely cured product immediately after the preparation was measured based on the formula below, using a digital length measuring system (MS-5C, manufactured by Nikon Corporation), and measuring the distance of sensor head displaced from the sheet surface when a load of 7 g/mm$^2$ was applied with the sensor head. A larger sheet hardness value indicates a higher degree of hardness.

Sheet hardness=[1−{distance of sensor head displaced (μm)/thickness of sample (μm)}]×100

Examination Example 2

Storage Stability

The sheet hardness was determined in the same manner as in Examination Example 1, for the semi-cured product of immediately after preparation and the semi-cured product after storage at 5° C. for 24 hours. Then, the ratio of the obtained sheet hardness (after storage/immediately after preparation×100) was calculated as a hardness retention rate (%), and storage stability was evaluated based on the following evaluation criteria. A smaller hardness retention rate value indicates a better storage stability in semi-cured state.

[Evaluation Criteria of Storage Stability]
Excellent: hardness retention rate of 100% or more and 200% or less
Good: hardness retention rate of more than 200% and 900% or less
Poor: hardness retention rate of more than 900%

Examination Example 3

Light Transmittance

The light transmission (%) at a wavelength of 450 nm of the completely cured products was measured using a spectrophotometer (U-4100, manufactured by Hitachi High-Technologies Corporation.). A higher light transmission indicates excellent light transmittance.

Examination Example 4

Heat Resistance

The completely cured products were allowed to stand in a hot air dryer of 150° C., and appearance of the completely cured products after an elapse of 100 hours was visually observed. Those completely cured products with no discoloration compared with the state before the storage were regarded "Good", and those completely cured products with discoloration were regarded as "Bad". Those with no changes in appearance after storage indicates excellent heat resistance.

Examination Example 5

Encapsulation Properties

The conditions of the optical semiconductor devices before and after encapsulation were observed with an optical microscope. Those optical semiconductor devices in which the optical semiconductor element was completely embedded, no bonding wire was deformed or damaged, and the light could be turned on were regarded as "Good"; and those optical semiconductor devices in which the light could not be turned on were regarded as "Bad".

Examination Example 6

Light Resistance

An electric current of 300 mA was applied to the optical semiconductor devices to light the LED elements, and the luminance immediately after the start of the examination was measured with a multi channel photo detector system (MCPD-3000, manufactured by Otsuka Electronics Co. Ltd.). Thereafter, the LED elements were allowed to stand with the light on, and the luminance after an elapse of 300 hours was measured in the same manner. The luminance retention rate was calculated based on the formula below, and light resistance was evaluated. A higher luminance retention rate indicates excellent light resistance.

Luminance retention rate (%)=(luminance after elapse of 300 hours/luminance immediately after start of examination)×100 for 24 hours, the bonding wire distorted significantly and caused shorting, and the LED could not be turned on.

While the illustrative embodiments of the present invention are provided in the above description, such is for illustrative purpose only and it is not to be construed as limiting in any manner. Modifications and variations of the present invention that will be obvious to those skilled in the art is to be covered by the appended claims.

What is claimed is:

1. A silicone resin sheet obtained by molding a silicone resin composition into a sheet, and then semi-curing the sheet,
    wherein the silicone resin composition comprises:
    (1) an organopolysiloxane having at least two alkenylsilyl groups in one molecule,
    (2) an organopolysiloxane having at least two hydrosilyl groups in one molecule,
    (3) a hydrosilylation catalyst, and
    (4) a curing retarder,

TABLE 1

|  |  |  | Example 1 | Example 2 | Example 3 | Example 4 | Comp. Ex. 1 |
|---|---|---|---|---|---|---|---|
| Composition | Dimethylvinylsilyl-Terminated Polydimethylsiloxane | Average Molecular Weight | 28000 | 49500 | 28000 | 28000 | 28000 |
|  |  | Vinylsilyl Group Equivalent | 0.071 mmol/g | 0.040 mmol/g | 0.071 mmol/g | 0.071 mmol/g | 0.071 mmol/g |
|  |  | Viscosity | 1000 mPa·s | 5000 mPa·s | 1000 mPa·s | 1000 mPa·s | 1000 mPa·s |
|  |  | Blending Amount | 100 Parts | 100 Parts | 100 Parts | 100 Parts | 100 Parts |
|  | Trimethylsilyl-Terminated Dimethylsiloxane-Methylhydrosiloxane Copolymer | Average Molecular Weight | 2000 | 2000 | 1000 | 2000 | 2000 |
|  |  | Hydrosilyl Group Equivalent | 4.1 mmol/g | 4.1 mmol/g | 7.1 mmol/g | 4.1 mmol/g | 4.1 mmol/g |
|  |  | Viscosity | 30 mPa·s | 30 mPa·s | 15 mPa·s | 30 mPa·s | 30 mPa·s |
|  |  | Blending Amount | 2 Parts | 2 Parts | 1.2 Parts | 2 Parts | 2 Parts |
|  | Platinum-Divinyltetramethyldisiloxane Complex | Blending Amount | 0.0036 Parts | 0.0036 Parts | 0.0036 Parts | 0.0036 Parts | 0.0036 Parts |
|  | Tetraalkylammonium Hydroxide | Types | Tetramethylammonium Hydroxide | Tetramethylammonium Hydroxide | Tetramethylammonium Hydroxide | Tetrabutylammonium Hydroxide | — |
|  |  | Blending Amount | 0.026 Parts | 0.026 Parts | 0.026 Parts | 0.075 Parts | 0 |
|  | Hexamethyldisilazane-Treated Silica Particles | Blending Amount | 10 Parts | 10 Parts | 10 Parts | 10 Parts | 10 Parts |
| Before Curing | Viscosity |  | 1300 | 5200 | 1300 | 1300 | 1300 |
| Semi-Cured Product | Curing Conditions |  | 80° C., 15 min. | 80° C., 18 min. | 80° C., 15 min. | 80° C., 11 min. | 80° C., 2 min. |
|  | Hardness Immediately after Preparation |  | 1.2 | 1.5 | 1.3 | 1.3 | 2.0 |
|  | Hardness after Storage |  | 1.7 | 1.9 | 1.9 | 3.9 | 20 |
|  | Storage Stability |  | Excellent | Excellent | Excellent | Good | Poor |
| Completely cured product | Hardness Immediately after Preparation |  | 80.5 | 64.9 | 70.9 | 82.0 | 85.0 |
|  | Light Transmission |  | 95% | 94% | 94% | 95% | 95% |
|  | Heat Resistance |  | Good | Good | Good | Good | Good |
| LED device | Encapsulation Properties |  | Good | Good | Good | Good | Bad |
|  | Light Resistance (luminance retention rate) |  | 99.8% | 99.6% | 99.5% | 99.8% | — |

The results show that any of the silicone resin sheets of Examples is excellent in storage stability of semi-cured products, has excellent heat resistance and light resistance, and furthermore, the changes in hardness even with the sheet after storage at 5° C. are less and encapsulation are possible. Therefore, the silicone resin sheets of Examples have sufficient characteristics as an LED encapsulating material. On the other hand, the silicone resin sheet of Comparative Example 1 was poor in storage stability of semi-cured product, and when encapsulating LED using the sheet after storage at 5° C.

wherein a hydrosilyl group functional group equivalent of the organopolysiloxane having at least two hydrosilyl groups in one molecule is 0.010 to 5 mmol/g,
wherein the curing retarder contains tetraalkylammonium hydroxide, and
the tetraalkylammonium hydroxide content is 10 to 500 mol relative to 1 mol of the hydrosilylation catalyst, and
the silicone resin sheet is semi-cured.

* * * * *